United States Patent
Sugiyama et al.

(10) Patent No.: US 8,764,994 B2
(45) Date of Patent: Jul. 1, 2014

(54) METHOD FOR FABRICATING EMITTER

(71) Applicant: Hitachi High-Tech Science Corporation, Tokyo (JP)

(72) Inventors: Yasuhiko Sugiyama, Tokyo (JP); Kazuo Aita, Tokyo (JP); Fumio Aramaki, Tokyo (JP); Tomokazu Kozakai, Tokyo (JP); Osamu Matsuda, Tokyo (JP); Anto Yasaka, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/845,630

(22) Filed: Mar. 18, 2013

(65) Prior Publication Data

US 2013/0248483 A1    Sep. 26, 2013

(30) Foreign Application Priority Data

Mar. 23, 2012   (JP) .................................. 2012-068032

(51) Int. Cl.
*B44C 1/22*  (2006.01)
*C25F 3/00*  (2006.01)

(52) U.S. Cl.
USPC .............................................. 216/11; 216/66

(58) Field of Classification Search
USPC ....................................................... 216/11, 66
See application file for complete search history.

(56) References Cited

U.S. PATENT DOCUMENTS

| 7,368,727 B2 * | 5/2008 | Ward ........................ 250/423 R |
| 2010/0006447 A1 * | 1/2010 | Winkler et al. ............... 205/205 |

FOREIGN PATENT DOCUMENTS

JP   07240165   9/1995

* cited by examiner

*Primary Examiner* — Roberts Culbert
(74) *Attorney, Agent, or Firm* — Adams & Wilks

(57) ABSTRACT

A method for fabricating a sharpened needle-like emitter, the method including: electrolytically polishing an end portion of an electrically conductive emitter material so as to be tapered toward a tip portion thereof; performing a first etching in which the electrolytically polished part of the emitter material is irradiated with a charged-particle beam to form a pyramid-like sharpened part having a vertex including the tip portion; performing a second etching in which the tip portion is further sharpened through field-assisted gas etching, while observing a crystal structure at the tip portion by a field ion microscope and keeping the number of atoms at a leading edge of the tip portion at a predetermined number or less; and heating the emitter material to arrange the atoms at the leading edge of the tip portion of the sharpened part in a pyramid shape.

4 Claims, 10 Drawing Sheets

US 8,764,994 B2

METHOD FOR FABRICATING EMITTER

CROSS-REFERENCE TO RELATED APPLICATIONS

This application claims priority from Japanese Patent Application No. 2012-068032 filed on Mar. 23, 2012, the entire contents of which are incorporated herein by reference.

TECHNICAL FIELD

Aspects of the present invention relate to a method for fabricating an emitter used as an emission source for emitting electrons or ions, for example.

BACKGROUND

Focused ion beam apparatuses have been known as apparatuses for observation, various evaluations, analyses, and the like on samples of semiconductor devices or the like and for fabrication of transmission electron microscope (TEM) samples made from fine thin samples extracted from the samples and fixed on sample holders.

This type of focused ion beam apparatus includes an ion source emitting ions. The emitted ions are formed into a focused ion beam (FIB) for irradiation.

Some types of ion sources are known, including plasma ion sources and liquid-metal ion sources. As an alternative ion source that can produce a focused ion beam with a higher luminance and a smaller beam diameter than the above-mentioned counterparts, a gas field ion source (GFIS) has been known (see JP-A-H07-240165, for example).

A gas field ion source mainly includes an emitter with a tip portion sharpened into atomic level, a gas source that supplies helium (He) or other gas to the periphery of the emitter, a cooling unit that cools the emitter, and an extracting electrode spaced apart from the tip portion of the emitter.

This configuration, after supply of gas, applies an extracting voltage between the emitter and the extracting electrode and cools the emitter. As a result, the gas is ionized into gas ions due to a high electric field at the tip portion of the emitter. The resulting gas ions repel at the emitter maintained at a positive electric potential and are extracted toward the extracting electrode. The gas ions then are then converged into a focused ion beam, while being accelerated moderately.

In particular, ions emitted from a gas field ion source have a higher luminance and a smaller light-source diameter as described above and also have a smaller energy spread. Therefore, the ions emitted from the gas field ion source can be applied on samples with their beam diameter highly focused. This enables higher-resolution observation and finer etching, for example.

To produce a focused ion beam with a small beam diameter, the emitter preferably has a pyramid crystal structure at its tip portion whose leading edge is arranged with the smallest possible number of atoms. This structure enables gas to be ionized locally to produce gas ions, thereby producing a focused ion beam with a small beam diameter. For this reason, the tip portion of the emitter needs to have this crystal structure maintained in a constantly stable manner.

However, the crystal structure at the tip portion of the emitter can be easily broken and deformed from the original state. To address this, a method (treatment) is known for restoring the crystal structure at the tip portion of the emitter to the original state.

Specifically, the tip portion of the emitter is heated up to about 700° C. to 900° C., for example, whereby the atoms are rearranged and the crystal structure is restored to the original state. This treatment is performed periodically or as required for rearrangement of the atoms, so that the crystal structure at the tip portion of the emitter can be restored to the original state.

As described above, the crystal structure at the tip portion of the emitter ideally has atoms in a regular pyramid arrangement. However, a practical method for arranging atoms in an ideal pyramid without fail has not been established yet. Related-art emitters thus have a structure with a large number of atoms arranged at their leading edges.

Reliable reproducibility may not be provided by the above-described treatment performed for the rearrangement of atoms because of the large number of atoms arranged. The crystal structure remains incomplete in many cases, resulting in low yield of thermal restoration.

Because of the large number of atoms, a long heating time is typically required for their rearrangement. This means, even if the atoms are successfully rearranged, the tip shape of the emitter is likely to grow large because of thermal effects. The optimum value of the extracting voltage to be applied to the emitter, as a result, inevitably increases every time the treatment is performed as shown in FIG. 19.

In particular, a rise in the optimum value of the extracting voltage can increase load on the emitter and render the emitter easily damaged through electric discharge or other factors. As the voltage approaches the output limit of the extracting voltage of the apparatus, the emitter can no longer be used, which results in a shorter life of the emitter.

SUMMARY

The present invention has been made in view of these circumstances and is directed to providing a method for fabricating an emitter. According to the method, an emitter, whose leading edge has a crystal structure restorable to the original state with high reproducibility through rearrangement of atoms by treatment, whose optimum value of the extracting voltage is kept from rising after the treatment, and which can be used for a long time, is produced.

In view of the foregoing, the present invention provides the following means:

(1) According to an aspect of the present invention, there is provided a method for fabricating a sharpened needle-like emitter, the method including: electrolytically polishing an end portion of an electrically conductive emitter material so as to be tapered toward a tip portion thereof; performing a first etching in which the electrolytically polished part of the emitter material is irradiated with a charged-particle beam to form a pyramid-like sharpened part having a vertex including the tip portion; performing a second etching in which the tip portion of the sharpened part is further sharpened through field-assisted gas etching, while observing a crystal structure at the tip portion of the sharpened part by a field ion microscope and keeping the number of atoms at a leading edge of the tip portion of the sharpened part at a predetermined number or less; and heating the emitter material to arrange the atoms at the leading edge of the tip portion of the sharpened part in a pyramid shape.

The method for fabricating an emitter according to the present invention starts with the electrolytic polishing of the end portion of the emitter material so as to be tapered toward a tip portion thereof. This makes the end portion of the emitter material has a diameter of not more than 100 nm, for example, resulting in a substantially sharpened state. Next, the electrolytically polished part is irradiated with a charged-particle beam to perform etching and form a pyramid-like sharpened part with a vertex of 20° or less, for example. Accordingly, it is possible to fabricate a sharpened part of a pyramid shape (triangular pyramid or hexagonal pyramid, for example) which is sharpened in the order of nanometers. In particular, since the charged-particle beams are used, variation in processing can be reduced so that the sharpened part can be finely fabricated into a desired shape.

The tip portion is then processed to be further sharpened in the order of atomic level through field-assisted gas etching, while the crystal structure at the tip portion of the sharpened part is observed under a field ion microscope. In this process, the number of atoms at the leading edge decreases as the tip portion is further sharpened. By keeping processing the tip portion until the number of atoms at the leading edge reaches a predetermined number or less (several to several dozens, for example) on the basis of the observation under the field ion microscope, the shape of the sharpened part can be sharpened in the order of atomic level. In particular, because the number of atoms at the leading edge of the sharpened part is reduced to a predetermined number or less, the leading edge can be configured by a far smaller number of atoms compared to related-art.

The emitter material finally undergoes the heating step of heating the emitter material to arrange the atoms at the leading edge of the sharpened part in a pyramid shape. In this process, because the number of atoms at the leading edge is smaller than in related-art, the fewer atoms are readily arranged in an ideal pyramid shape. This can fabricate a sharpened needle-like emitter with one atom or three atoms at its leading edge, for example.

The thus fabricated emitter can emit electrons or ions with a small light-source diameter and a high luminance. In particular, because the number of atoms at the leading edge is smaller than in related-art, the fewer atoms are efficiently rearranged through thermal treatment and their crystal structure can be restored to the original pyramid shape with high reproducibility. This can enhance the yield of thermal restoration.

The efficient rearrangement of the fewer atoms can keep the heating time short and keep the diameter of the tip portion of the emitter from growing large. The optimum value of the extracting voltage can be, therefore, kept from rising after the treatment, which extends the life of the emitter and allows it to be used for a long time.

DETAILED DESCRIPTION

An embodiment according to the present invention will be described with reference to the accompanying drawings.

This embodiment describes an emitter included in a gas field ion source (GFIS) and serving as an emission source emitting ion beams, as an example.

A focused ion beam apparatus that includes a focused ion beam column including the gas field ion source will be briefly described.

Focused Ion Beam Apparatus

Figure 1:
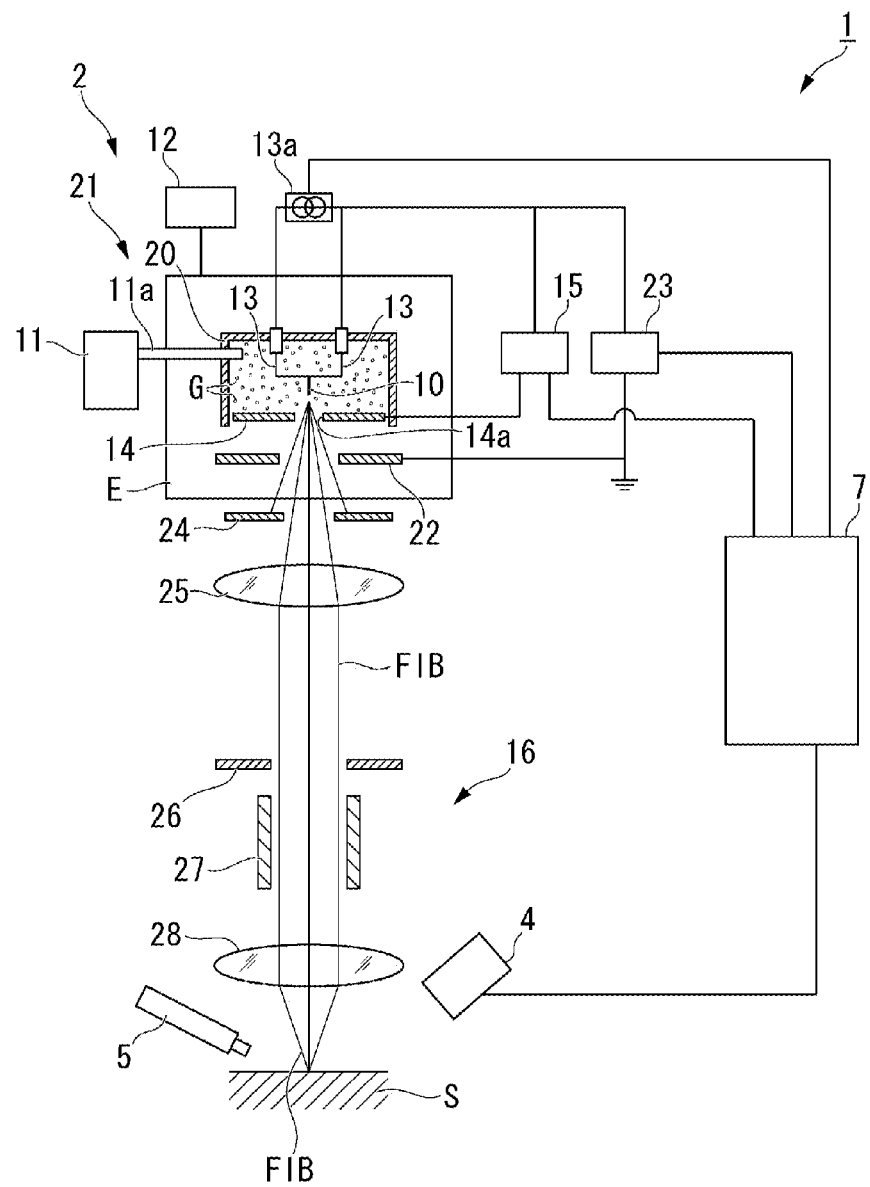
FIG. 1 is an overall configuration diagram illustrating an embodiment of a focused ion beam apparatus including an emitter according to the present invention.

As illustrated in FIG. 1, the focused ion beam apparatus 1 mainly includes a focused ion beam column 2 that irradiates a sample S placed on a stage (not illustrated) with a focused ion beam (FIB), a detector 4 that detects secondary charged particles generated by irradiation of the FIB, a gas gun 5 that supplies material gas for forming a deposition film, and a controller 7 that produces image data on the basis of the detected secondary charged particles and causes a display (not illustrated) to display the image data.

The stage operates on the basis of instructions from the controller 7. For example, the stage can be displaced on five axes. Displacing the stage on five axes as appropriate can cause emission of the FIB onto a desired position. This stage is housed in a vacuum chamber (not illustrated) in which FIB irradiation and supply of material gas are performed, for example.

The focused ion beam column 2 includes an emitter 10, a gas source 11, a cooling unit 12, a heater 13, an extracting electrode 14, an extracting power source 15, and a beam optics 16.

Figure 2:
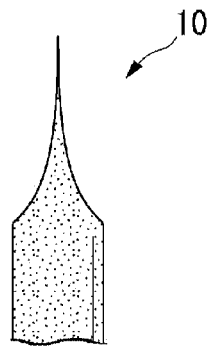
FIG. 2 is an enlarged view of the emitter illustrated in FIG. 1.
Figure 3:
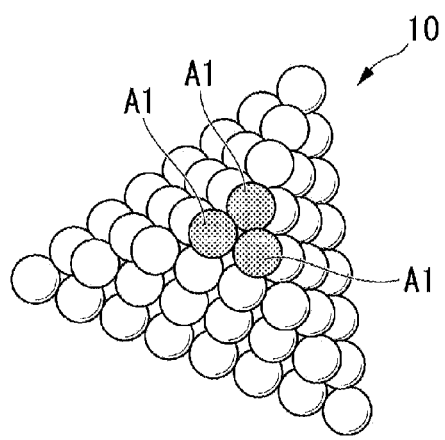
FIG. 3 is an enlarged, atomic-level view of the tip of the emitter illustrated in FIG. 2.
Figure 4:
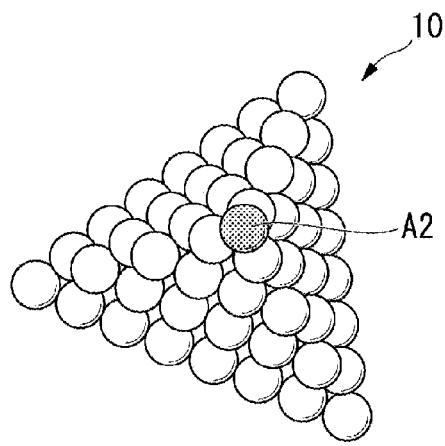
FIG. 4 is another enlarged, atomic-level view of the tip of the emitter illustrated in FIG. 2.

The emitter 10 is a needle-like electrically conductive member with a sharpened tip portion as illustrated in FIG. 2, and is an emission source emitting ion beams. The emitter 10 is fabricated by a method described later and its tip portion is sharpened on the order of atomic level. More specifically, the tip portion is formed to have a crystal structure arranged in a pyramid. For example, the tip portion is formed to have a leading edge in which three atoms A1 are arranged as illustrated in FIG. 3 or one atom A2 is arranged as illustrated in FIG. 4.

The emitter 10 is supported, as illustrated in FIG. 1, while being housed in an ionizer chamber 20 inside of which is kept in a high-vacuum state. The gas source 11 can supply a small amount of gas (helium (He) gas, for example) G to the periphery of the emitter 10 through a gas inlet pipe 11a communicating with the ionizer chamber 20. The heater 13 locally heats the tip portion of the emitter 10, and is a filament, for example. The heater 13 serves to locally heat the tip portion of the emitter 10 up to a predetermined temperature by means of electric current from a current source 13a operating on the basis of instructions from the controller 7, thereby rearranging atoms constituting the emitter 10.

Provided to the opening of the ionizer chamber 20 is the extracting electrode 14 spaced apart from the tip portion of the emitter 10. The extracting electrode 14 has an opening 14a at a position facing the tip portion of the emitter 10. The extracting power source 15 is an electrode that applies an extracting voltage to the space between the extracting electrode 14 and the emitter 10. By applying the extracting voltage, the extracting power source 15 serves to ionize the gas G at the leading edge of the emitter 10 into gas ions, and extract the gas ions toward the extracting electrode 14 thereafter.

The cooling unit 12 cools the emitter 10 by means of liquid helium, liquid nitrogen, or other refrigerant. In this embodiment, the cooling unit 12 is designed to cool the whole space E including the extracting electrode 14 as illustrated in FIG. 1. Alternatively, the cooling unit 12 may be designed to cool at least the emitter 10. To cool the emitter, a refrigerator may be used.

The emitter 10, the gas source 11, the heater 13, the extracting electrode 14, the extracting power source 15, and the ionizer chamber 20 configure a gas field ion source 21 that generates gas ions from the gas G.

Provided below the extracting electrode 14 is a cathode 22 at a ground potential. To the space between the cathode 22 and the emitter 10, an accelerating voltage is applied from an accelerator power source 23, whereby the extracted gas ions are energized, accelerated, and turned into an ion beam. Provided below the cathode 22 is a first aperture 24 that focuses the ion beam. Provided below the first aperture 24 is a condenser lens 25 that concentrates the ion beam into a focused ion beam (FIB).

Provided below the condenser lens 25 is a second aperture 26 that is horizontally movable and further focuses the FIB. Provided below the second aperture 26 is a deflector 27 that moves the FIB over the sample S. Provided below the deflector 27 is an objective lens 28 that positions the focus of the FIB on the sample S.

The cathode 22, the accelerator power source 23, the first aperture 24, the condenser lens 25, the second aperture 26, the deflector 27, and the objective lens 28 configure the beam optics 16 that converts the extracted gas ions into the FIB and applies the FIB to the sample S. Although not illustrated in FIG. 1, this beam optics also includes an astigmatism corrector and a beam position adjuster included in known focused ion beam apparatuses.

The detector 4 detects secondary charged particles, such as secondary electrons, secondary ions, reflected ions, and scattered ions, generated from the sample S irradiated with the FIB. The detector 4 outputs detection results to the controller 7.

The gas gun 5 can supply compound gas containing the material of a deposition film (phenanthrene, platinum, carbon, or tungsten, for example) as material gas. The material gas is decomposed, through FIB irradiation and the resulting secondary charged particles, into gas and solid components. The solid component out of the two separated components is deposited to form a deposition film.

The gas gun 5 is loaded with a material capable of accelerating the progress of etching in a selective manner (xenon fluoride, chlorine, iodine, or water, for example). For example, xenon fluoride is used for a silicon-based sample S, whereas water is used for an organic sample S. This material is applied together with the ion beam, thereby advancing the progress of etching of a particular material.

In addition to totally controlling the above-described components, the controller 7 can change the extracting voltage, the accelerating voltage, beam current, and the like as appropriate. For this end, the controller 7 can adjust the beam diameter of the FIB as required and acquire an observation image, and can locally etch the sample S (for rough processing, finish processing, or the like), for example.

The controller 7 converts the secondary charged particles detected by the detector 4 into a luminance signal to produce observation image data, and outputs an observation image to the display on the basis of the observation image data. This enables visual observation of the observation image through the display.

In addition, the controller 7 is connected with an input unit (not illustrated) with which an operator can enter data. On the basis of signals input through this input unit, the controller 7 controls the components. This enables the operator, through the input unit, to observe or etch a desired region with the FIB irradiated thereto, or deposit a deposition film in a desired region with material gas supplied and the FIB irradiated thereto.

Method for Fabricating Emitter

Figure 5:
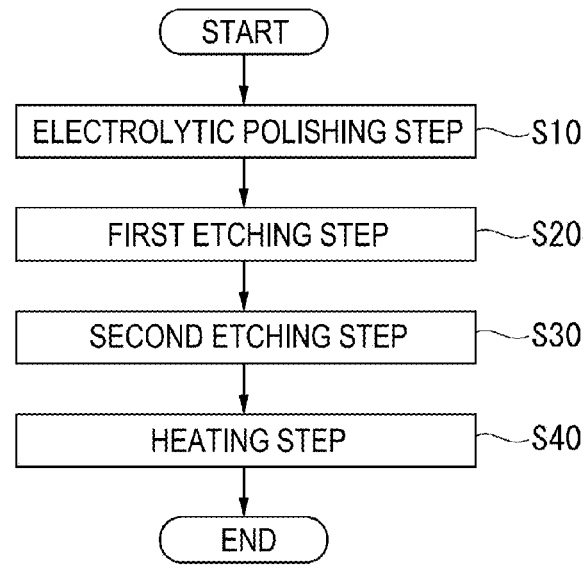
FIG. 5 is a flowchart of a method for fabricating the emitter illustrated in FIG. 2.

A method for fabricating the emitter 10 will now be described with reference to the flowchart in FIG. 5.

The procedure starts with an electrolytic polishing step (S10) in which an end portion of the emitter material is electrolytically polished so as to be tapered toward a tip portion thereof.

Figure 6:
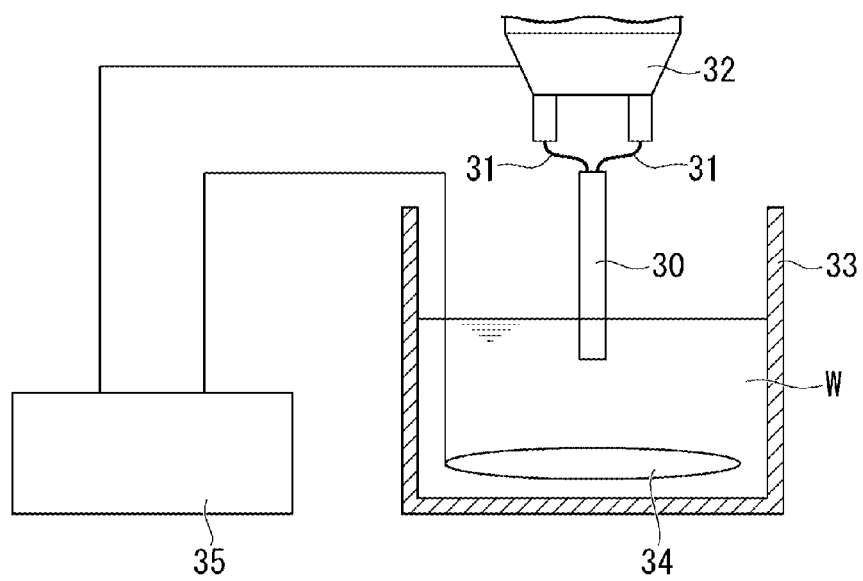
FIG. 6 is a view illustrating a step of fabricating the emitter, depicting a state in which the tip of an emitter material is being electrolytically polished.

Specifically, as illustrated in FIG. 6, a wire made of a tungsten single crystal having a crystal plane (111) along the axial direction is prepared, for example, as the emitter material 30. The base end of the emitter material 30 is retained by a retainer 32 with fixing wire rods 31, for example, interposed therebetween.

Employed as the wire as the emitter material 30 is a wire having a diameter of about 0.1 to 0.3 mm and a length of several millimeters, for example. The fixing wire rods 31 serve to heat the emitter material 30 by means of electric current flowing therethrough, in addition to supporting the emitter material 30.

The end portion of the emitter material 30 retained by the retainer 32 is immersed in a polishing solution W contained in a polishing bath 33. Examples of the polishing solution W may include 3 mol/L KOH (potassium hydroxide) solution. The polishing bath 33 also accommodates a cathode 34.

To the space between the emitter material 30 and the cathode 34, an etching voltage (of 3 V in DC, for example) is applied by a voltage applying unit 35 for a predetermined etching time (for about 400 seconds, for example), whereby the end portion of the emitter material 30 is electrolytically polished.

Figure 7:
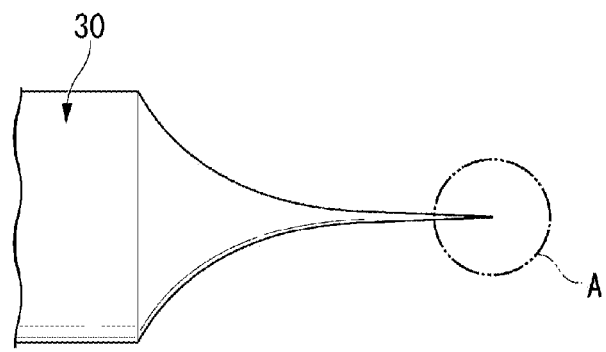
FIG. 7 is an enlarged view of the tip of the emitter material after being electrolytically polished as in FIG. 6.
Figure 8:
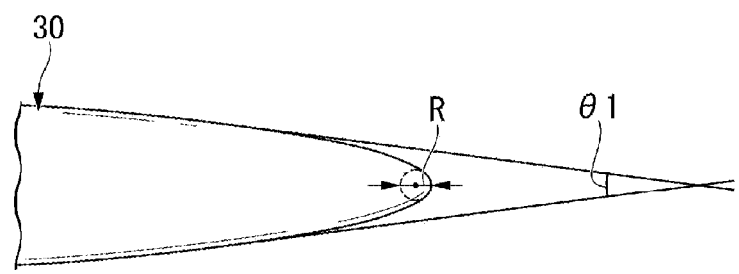
FIG. 8 is an enlarged view of the portion A in FIG. 7.

This process can substantially sharpen the end portion of the emitter material 30 to make a tapered tip portion as illustrated in FIG. 7. The electrolytic polishing is performed until the following processing targets are reached: the tip diameter R is 100 nm or less, more specifically, 30 to 80 nm, and an vertex angle θ1 is about 10° to 30° as illustrated in FIG. 8.

Figure 9:
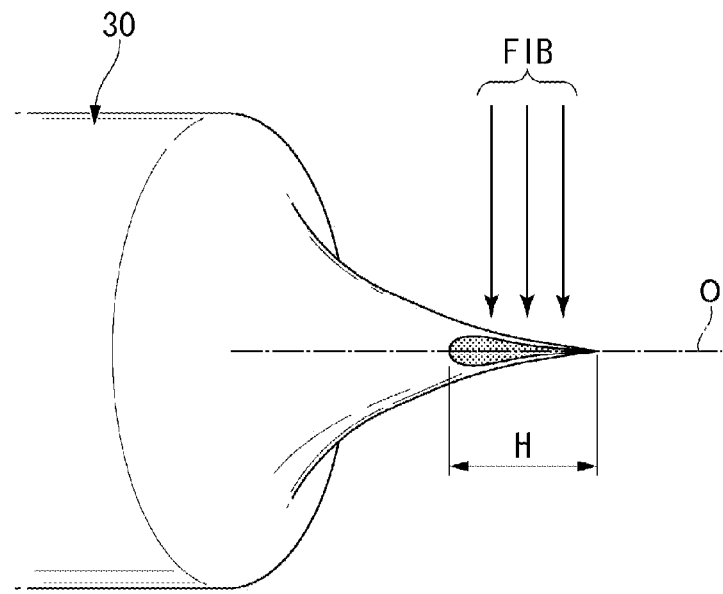
FIG. 9 is a view of an electrolytically processed part, after the electrolytic polishing, undergoing focused-ion-beam (FIB) etching.

After the completion of the electrolytic polishing step (S10), a first etching step (S20) follows in which the electrolytically polished part is irradiated with a focused ion beam (FIB) as illustrated in FIG. 9.

Figure 10:
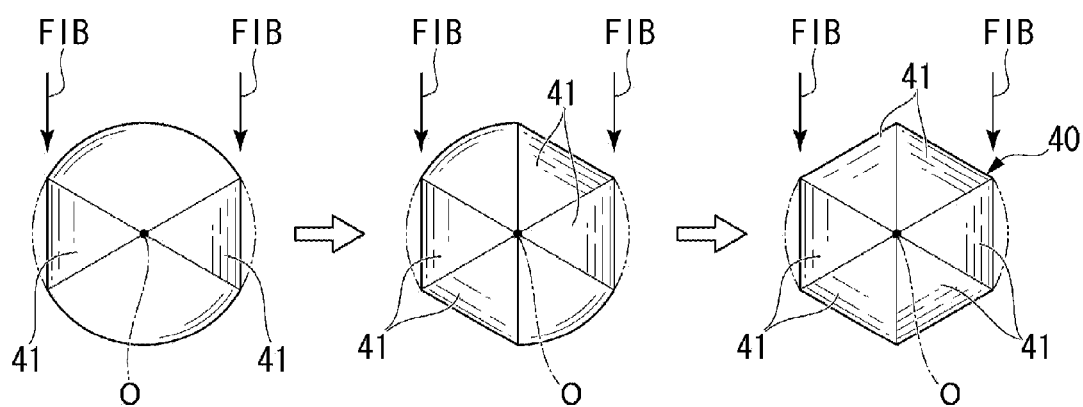
FIG. 10 is a view illustrating a process for forming a sharpened part sharpened through the FIB etching as in FIG. 9.

Specifically, a process region H extending for 50 μm, for example, from the tip portion of the electrolytically polished part is irradiated with a FIB, while the emitter material 30 is rotated intermittently about its axis O, to form a pyramid-like sharpened part 40 as illustrated in FIGS. 9 and 10. In this illustrated example, FIB processing is carried out to make six pyramidal surfaces 41 and form a hexagonal pyramid-like sharpened part 40.

Figure 11:
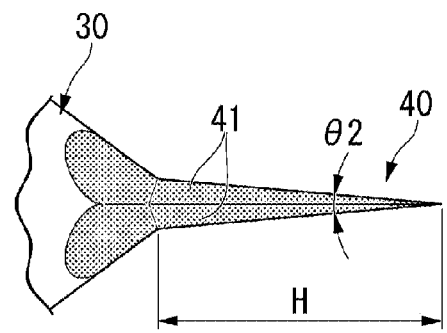
FIG. 11 is an enlarged view of a sharpened part formed at the tip of the emitter material through the FIB etching as in FIG. 9.

In this process, the sharpened part 40 is finished to have a vertex including the tip portion and having a vertex angle θ2 of 20° or less as illustrated in FIG. 11. In this illustrated example, the sharpened part 40 is finished to have a vertex angle θ2 of about 10°.

The first etching step (S20) can provide the hexagonal pyramid-like sharpened part 40 that is highly sharpened in the order of nanometers. In particular, the use of focused ion beams (FIB) can reduce variation in processing, so that the sharpened part 40 can be finely fabricated into a desired shape.

After the completion of the first etching step (S20), a second etching step (S30) follows in which the tip portion of the sharpened part 40 is further sharpened in the order of atomic level through field-assisted gas etching, while the crystal structure at the tip portion is observed by a field ion microscope (FIM).

This step will be described in detail.

Figure 12:
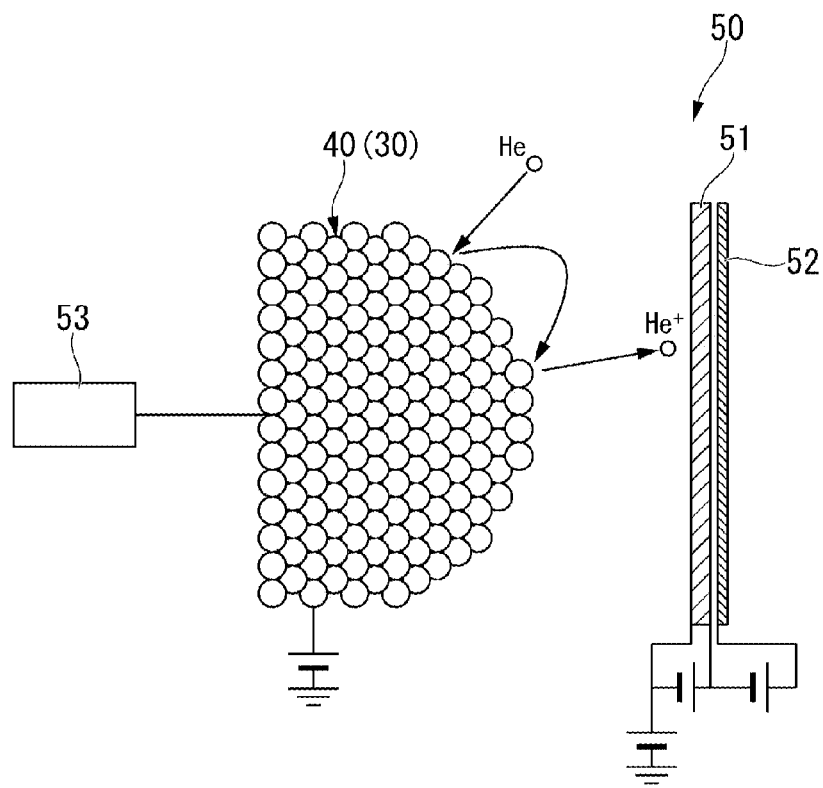
FIG. 12 is a view illustrating a state in which the emitter material illustrated in FIG. 11 is placed under a field ion microscope (FIM)

The FIM 50 includes a vacuum chamber (not illustrated) into which various types of gases are introduced under predetermined voltages, a microchannel plate (MCP) 51 that is spaced apart from the sharpened part 40 of the emitter material 30 in the vacuum chamber, a fluorescent screen 52 that displays thereon a FIM image of the tip portion of the sharpened part 40 amplified by the MCP 51, and a heating unit 53 that is a heater or the like for heating the emitter material 30, as illustrated in FIG. 12.

FIG. 12 illustrates the crystal structure at the sharpened part 40 of the emitter material 30.

Figure 13:
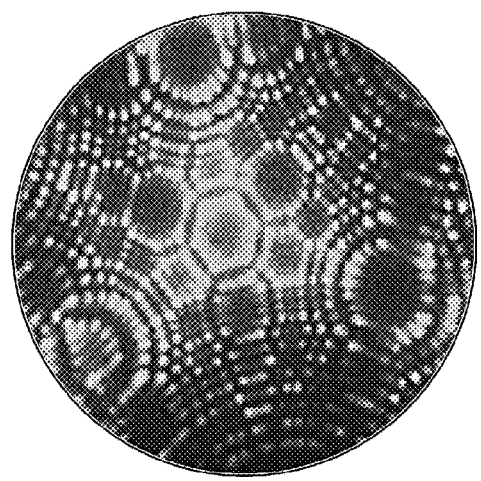
FIG. 13 is a FIM image of the leading edge of the sharpened part of the emitter material, observed under a field ion microscope.

In the thus configured FIM 50, in the case that an inert gas, for example, helium (He) gas is introduced into the vacuum chamber and a high voltage is applied to the emitter material 30, the helium gas is ionized due to an intense electric field in the vicinity of atoms at the tip portion of the sharpened part 40, and the resulting ions move toward the MCP 51 along the electric line of force. The helium ions are converted into electrons and amplified by the MCP 51, and then enter the fluorescent screen 52. This enables display of a FIM image of the tip portion of the sharpened part 40 on the fluorescent screen 52 as illustrated in FIG. 13, thereby enabling visual observation of the crystal structure.

In the case that mixed gas containing oxygen, nitrogen, or both (not illustrated) is introduced into the vacuum chamber in addition to the helium gas during the observation, the mixed gas reacts with and removes tungsten atoms to perform etching, whereby field-assisted gas etching is carried out.

Figure 14:
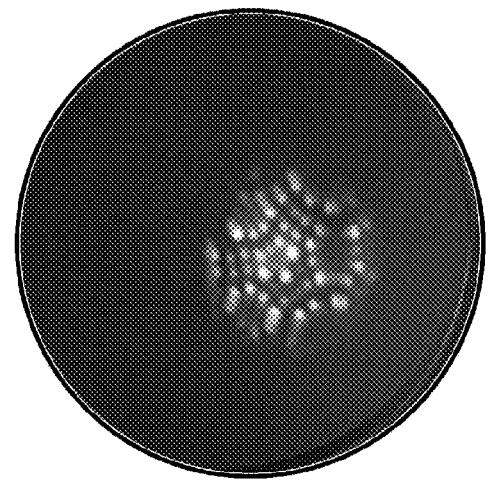
FIG. 14 is a FIM image of a state in which the number of atoms at the leading edge of the sharpened part of the emitter material has decreased through field-assisted gas etching.

The field-assisted gas etching can gradually shave the tip portion of the sharpened part 40, thereby sharpening the tip portion on the order of atomic level. In this process, the number of atoms at the leading edge reduces as the tip portion is further sharpened, and the number of luminescent spots in the FIM image reduces over time as illustrated in FIG. 14.

Figure 15:
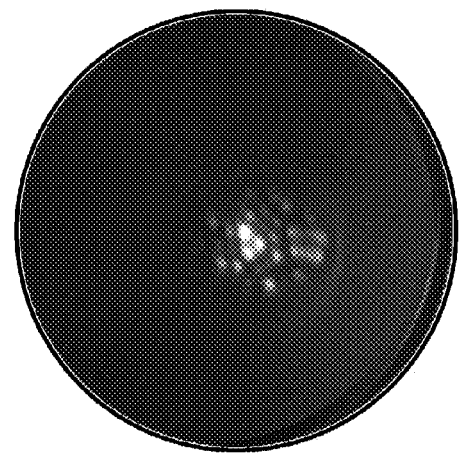
FIG. 15 is a FIM image of a state in which the number of atoms at the leading edge of the sharpened part of the emitter material has further decreased through field-assisted gas etching.

By keeping processing the tip portion until the number of atoms at the leading edge (the number of luminescent spots) reaches a predetermined number or less (several to several dozens, for example) on the basis of the observation under the FIM 50 as illustrated in FIG. 15, the shape of the sharpened part 40 can be sharpened in the order of atomic level. In particular, because the number of atoms at the leading edge of the sharpened part 40 is reduced down to a predetermined number or less, the leading edge can be composed of a far smaller number of atoms than those known.

After the completion of the second etching step (S30), a heating step (S40) follows in which the emitter material 30 is heated to arrange the atoms at the leading edge of the sharpened part 40 in a pyramid shape.

In the present embodiment, this step is performed to the emitter material 30 placed under the FIM 50. Specifically, the helium gas and mixed gas are discharged from the vacuum chamber and the application of the voltage to the emitter material 30 is stopped, and subsequently, the emitter material 30 is heated by the heating unit 53 at about 700° C. for about five minutes, for example.

This enables successful arrangement of the atoms. In particular, because the number of atoms at the leading edge is smaller than those known, the fewer atoms are arranged in an ideal pyramid shape. This can make such a crystal structure that have three atoms A1 as illustrated in FIG. 3 or one atom A2 as illustrated in FIG. 4 arranged at its leading edge, for example. Having atoms at its leading edge in such a crystal structure, the needle-like emitter 10 as illustrated in FIG. 2, sharpened in the order of atomic level, can be fabricated.

Figure 16:
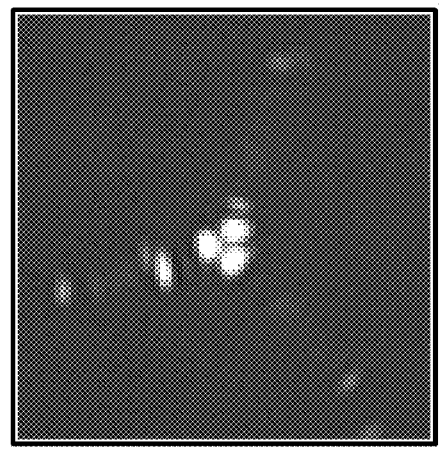
FIG. 16 is a FIM image of a state in which the crystal structure at the leading edge of the sharpened part of the emitter material is as illustrated in FIG. 3.
Figure 17:
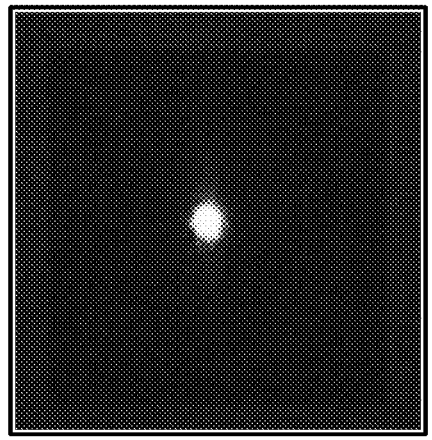
FIG. 17 is a FIM image of a state in which the crystal structure at the leading edge of the sharpened part of the emitter material is as illustrated in FIG. 4.

After the heating step (S40), helium gas is introduced into the vacuum chamber again and a voltage is applied to the emitter 10. Observation of a FIM image in this state will find three luminescent spots as illustrated in FIG. 16 or one luminescent spot as in FIG. 17, which indicates that the crystal structure has three atoms A1 or one atom A2 arranged at its leading edge.

The gas field ion source 21 including the thus fabricated emitter 10 can emit ion beams with a small light-source diameter and a high luminance. The use of focused ion beams (FIB) employing the ion beams for observing the sample S enables high-resolution observation, and the use for processing the sample S enables highly precise microfabrication.

If the crystal structure of the emitter 10 has changed with the use of the gas field ion source 21, the atoms are rearranged through thermal treatment. With the emitter 10 in the present embodiment, because the number of atoms at the leading edge is smaller than those known, the fewer atoms can be arranged efficiently as described above. The crystal structure can be, as a result, restored to the original pyramid shape with high reproducibility. This can enhance the yield of thermal restoration.

Figure 18:
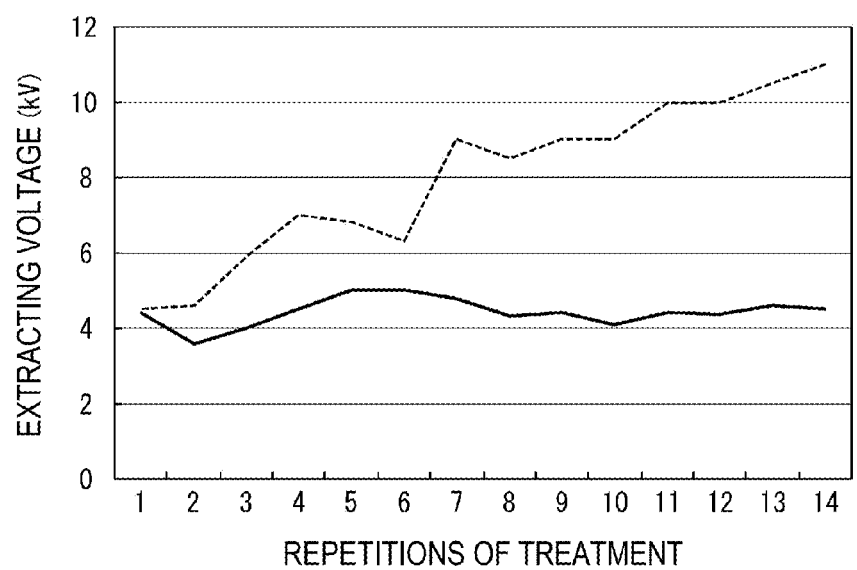
FIG. 18 is a chart showing a relation between the number of repetitions of treatment on the emitter according to the present invention and its extracting voltage.
Figure 19:
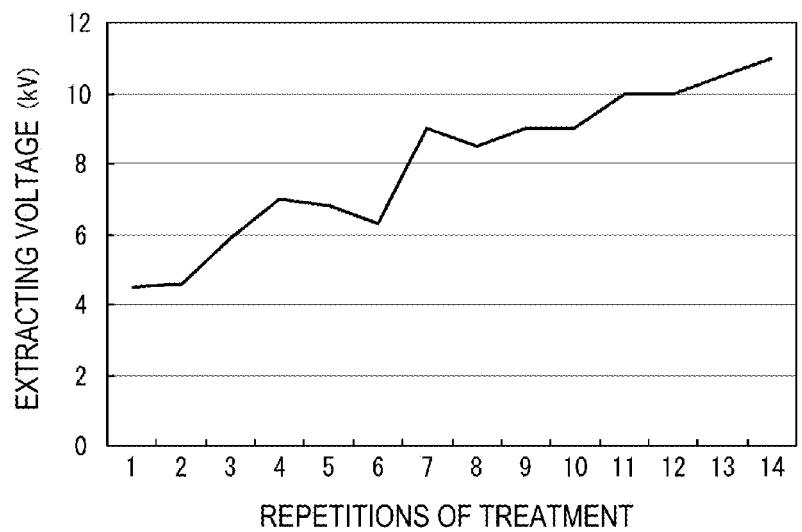
FIG. 19 is a chart showing a relation between the number of repetitions of treatment on a conventional emitter and its extracting voltage.

The efficient rearrangement of the fewer atoms can keep the heating time short and keep the diameter of the tip portion of the emitter 10 from growing large. The optimum value of the extracting voltage can be, therefore, kept from rising after the treatment and maintained at an almost constant level as indicated by the solid line in FIG. 18 in comparison with a known emitter indicated by the dotted line. This extends the life of the emitter 10 and allows it to be used for a long time.

The technical scope of the present invention is not limited to the above-described embodiment. Various modifications can be made without departing from the scope and spirit of the invention.

For example, while the embodiment describes the emitter 10 for use in the gas field ion source 21, the emitter is not limited to this. The emitter may be used as an emission source for emitting electrons that will be turned into electron beams, for example.

While a focused ion beam (FIB) is applied to perform etching in the first etching step (S20), any other charged-particle beam can be employed in place of the FIB. The etching may be performed using electron beams, for example. While the sharpened part 40 is formed into a hexagonal pyramid, it may be formed into any other pyramid shape, such as a triangular pyramid, 12-sided pyramid, 24-sided pyramid, and 36-sided pyramid. In such a case, the sharpened part 40 sharpened in the order of nanometers can be fabricated, and the number of atoms at the leading edge can be reduced in the subsequent second etching step (S30).

While the emitter material 30 placed under the FIM 50 is heated to use the FIM 50 in the heating step (S40), the emitter material 30 may be placed in the gas field ion source 21 after the second etching step (S30) to perform the heating step (S40), for example. This enables the gas field ion source 21 to start operating immediately after the heating step (S40).

While tungsten is employed as the emitter material 30, the material is not limited to this. However, by using tungsten which has a body-centered cubic structure, it is possible to easily arrange the atoms at the leading edge of the sharpened part 40 in an ideal pyramid shape. In addition, it is preferable to use tungsten which is chemically stable with a high melting point and high hardness, because by doing so, a high-quality emitter 10 can be made easily.

Further, Tungsten can be replaced with iridium. Also in this case, similar advantages to those achieved using tungsten can be provided.

The present invention provides illustrative, non-limiting aspects as follows:

(1) In a first aspect of the present invention, there is provided a method for fabricating a sharpened needle-like emitter, the method including: electrolytically polishing an end portion of an electrically conductive emitter material so as to be tapered toward a tip portion thereof; performing a first etching in which the electrolytically polished part of the emitter material is irradiated with a charged-particle beam to form a pyramid-like sharpened part having a vertex including the tip portion; performing a second etching in which the tip portion of the sharpened part is further sharpened through field-assisted gas etching, while observing a crystal structure at the tip portion of the sharpened part by a field ion microscope and keeping the number of atoms at a leading edge of the tip portion of the sharpened part at a predetermined number or less; and heating the emitter material to arrange the atoms at the leading edge of the tip portion of the sharpened part in a pyramid shape.

Accordingly, the method for fabricating an emitter starts with the electrolytic polishing of the end portion of the emitter material so as to be tapered toward a tip portion thereof. This makes the end portion of the emitter material has a diameter of not more than 100 nm, for example, resulting in a substantially sharpened state. Next, the electrolytically polished part is irradiated with a charged-particle beam to perform etching and form a pyramid-like sharpened part with a vertex of 20° or less, for example. Accordingly, it is possible to fabricate a sharpened part of a pyramid shape (triangular pyramid or hexagonal pyramid, for example) which is sharpened in the order of nanometers. In particular, since the charged-particle beams are used, variation in processing can be reduced so that the sharpened part can be finely fabricated into a desired shape.

The tip portion is then processed to be further sharpened in the order of atomic level through field-assisted gas etching, while the crystal structure at the tip portion of the sharpened part is observed under a field ion microscope. In this process, the number of atoms at the leading edge decreases as the tip portion is further sharpened. By keeping processing the tip portion until the number of atoms at the leading edge reaches a predetermined number or less (several to several dozens, for example) on the basis of the observation under the field ion microscope, the shape of the sharpened part can be sharpened in the order of atomic level. In particular, because the number of atoms at the leading edge of the sharpened part is reduced to a predetermined number or less, the leading edge can be configured by a far smaller number of atoms compared to related-art.

The emitter material finally undergoes the heating step of heating the emitter material to arrange the atoms at the leading edge of the sharpened part in a pyramid shape. In this process, because the number of atoms at the leading edge is smaller than in related-art, the fewer atoms are readily arranged in an ideal pyramid shape. This can fabricate a sharpened needle-like emitter with one atom or three atoms at its leading edge, for example.

The thus fabricated emitter can emit electrons or ions with a small light-source diameter and a high luminance. In particular, because the number of atoms at the leading edge is smaller than in related-art, the fewer atoms are efficiently rearranged through thermal treatment and their crystal structure can be restored to the original pyramid shape with high reproducibility. This can enhance the yield of thermal restoration.

The efficient rearrangement of the fewer atoms can keep the heating time short and keep the diameter of the tip portion of the emitter from growing large. The optimum value of the extracting voltage can be, therefore, kept from rising after the treatment, which extends the life of the emitter and allows it to be used for a long time.

(2) In a second aspect, there is provided the method for fabricating an emitter according to the first aspect, wherein in the first etching, etching is performed such that a vertex angle of the sharpened part becomes 10° or less through irradiation of a focused ion beam.

Accordingly, etching is carried out using a focused ion beam, which is suitable for microfabrication, to make a vertex of 10° or less. This can fabricate a further sharpened, pyramid-like sharpened part in a stable manner. The number of atoms at the leading edge can be, as a result, further reduced in the subsequent second etching step, which can exert the above-described advantages more significantly.

(3) In a third aspect, there is provided the method for fabricating an emitter according to the first or second aspect, wherein tungsten is employed as the emitter material.

(4) In a fourth aspect, there is provided the method for fabricating an emitter according to the first or second aspect, wherein iridium is employed as the emitter material.

Accordingly, since tungsten, which has a body-centered cubic structure, or iridium, which has a face-centered cubic structure, is used as the emitter material, the atoms at the leading edge of the sharpened part can be easily arranged in an ideal pyramid shape. By using tungsten or iridium, each of which is chemically stable with a high melting point and high hardness, a high-quality emitter can be fabricated.

What is claimed is:

1. A method for fabricating a sharpened needle-like emitter, the method comprising:

electrolytically polishing an end portion of an electrically conductive emitter material so as to be tapered toward a tip portion thereof;

performing a first etching in which the electrolytically polished part of the emitter material is irradiated with a charged-particle beam to form a pyramid-like sharpened part having a vertex including the tip portion;

performing a second etching in which the tip portion of the sharpened part is further sharpened through field-assisted gas etching, while observing a crystal structure at the tip portion of the sharpened part by a field ion microscope and keeping the number of atoms at a leading edge of the tip portion of the sharpened part at a predetermined number or less; and heating the emitter material to arrange the atoms at the leading edge of the tip portion of the sharpened part in a pyramid shape.

2. The method for fabricating an emitter according to claim 1, wherein in the first etching, etching is performed such that a vertex angle of the sharpened part becomes 10° or less through irradiation of a focused ion beam.

3. The method for fabricating an emitter according to claim 1, wherein tungsten is employed as the emitter material.

4. The method for fabricating an emitter according to claim 1, wherein iridium is employed as the emitter material.

* * * * *